US008686823B2

(12) United States Patent
Asano et al.

(10) Patent No.: US 8,686,823 B2
(45) Date of Patent: Apr. 1, 2014

(54) ELECTRONIC UNIT

(75) Inventors: Hiroaki Asano, Aichi-ken (JP); Sadanori Suzuki, Aichi-ken (JP); Kiminori Ozaki, Aichi-ken (JP); Yasuhiro Koike, Aichi-ken (JP); Hitoshi Shimadu, Aichi-ken (JP); Tetsuya Furata, Aichi-ken (JP); Tomoaki Asai, Aichi-ken (JP); Takahiro Hayakawa, Aichi-ken (JP); Ryou Yamauchi, Aichi-ken (JP); Masao Miyake, Aichi-ken (JP)

(73) Assignee: Kabushiki Kaisha Toyota Jidoshokki, Aichi-Ken (JP)

( * ) Notice: Subject to any disclaimer, the term of this patent is extended or adjusted under 35 U.S.C. 154(b) by 157 days.

(21) Appl. No.: 13/355,818

(22) Filed: Jan. 23, 2012

(65) Prior Publication Data

US 2012/0195005 A1 Aug. 2, 2012

(30) Foreign Application Priority Data

Jan. 28, 2011 (JP) ................................ 2011-016611

(51) Int. Cl.
*H01F 5/00* (2006.01)
*H05K 7/20* (2006.01)

(52) U.S. Cl.
USPC ............ 336/200; 361/704; 361/707; 165/185

(58) Field of Classification Search
USPC .................... 336/200; 361/704, 707; 165/185
See application file for complete search history.

(56) References Cited

U.S. PATENT DOCUMENTS

| | | | | |
|---|---|---|---|---|
| 4,873,757 | A * | 10/1989 | Williams | 29/602.1 |
| 5,760,671 | A * | 6/1998 | Lahr et al. | 336/200 |
| 5,781,093 | A * | 7/1998 | Grandmont et al. | 336/232 |
| 6,404,317 | B1 * | 6/2002 | Mizoguchi et al. | 336/200 |
| 6,914,508 | B2 * | 7/2005 | Ferencz et al. | 336/200 |
| 8,089,331 | B2 * | 1/2012 | Jacobson et al. | 336/84 C |
| 8,502,632 | B2 * | 8/2013 | Suganuma et al. | 336/200 |
| 2005/0270745 | A1 | 12/2005 | Chen et al. | |
| 2009/0079528 | A1 | 3/2009 | Shabany et al. | |
| 2012/0161911 | A1 * | 6/2012 | Moiseev et al. | 336/55 |
| 2013/0162383 | A1 * | 6/2013 | Moiseev | 336/92 |

FOREIGN PATENT DOCUMENTS

| | | | |
|---|---|---|---|
| JP | 4-20217 | | 2/1992 |
| JP | 2007-59839 | | 3/2007 |
| JP | 2007059839 | A * | 3/2007 |
| JP | 2010-153724 | | 7/2010 |
| WO | 2004/040599 | | 5/2004 |

OTHER PUBLICATIONS

English machine translation of Suganuma et al., Japanese publication JP 2007-059839A, Mar. 8, 2007, translated on Dec. 6, 2013.*

* cited by examiner

*Primary Examiner* — Robert J Hoffberg
(74) *Attorney, Agent, or Firm* — Greenblum & Bernstein, P.L.C.

(57) ABSTRACT

An electronic unit includes a double-sided substrate having an insulation substrate, a patterned first metal plate bonded on one side of the insulation substrate, and a patterned second metal plate bonded on the other side of the insulation substrate, and also includes a heat radiation member for releasing heat from the double-sided substrate. The heat radiation member is disposed adjacent to one of the first metal plate and the second metal plate generating a larger amount of heat than the other of the first metal plate and the second metal plate.

8 Claims, 7 Drawing Sheets

ELECTRONIC UNIT

BACKGROUND OF THE INVENTION

The present invention relates to an electronic unit.

Japanese Unexamined Utility Model Application Publication No. 4-20217 discloses a planar coil device having a sheet coil, a heat radiation plate and a core. Specifically, the sheet coil is formed by an insulation sheet and a foil conductor provided on the insulation sheet to form a coil. The heat radiation plate is insulated from the sheet coil. The sheet coil and the heat radiation plate are stacked together and fitted in the core.

There is known an electronic unit such as a transformer using a double-sided substrate such as a thick copper substrate. The thick copper substrate has a structure that patterned copper plates are bonded on opposite surfaces of the insulation substrate. In the electronic unit using such thick copper double-sided substrate, there is no established technique for accomplishing efficient heat radiation.

The present invention is directed to providing an electronic unit having a double-sided substrate in which metal plates are bonded on opposite surfaces of an insulation substrate and also allowing efficient heat radiation.

SUMMARY OF THE INVENTION

In accordance with an aspect of the present invention, an electronic unit includes a double-sided substrate having an insulation substrate, a patterned first metal plate bonded on one side of the insulation substrate, and a patterned second metal plate bonded on the other side of the insulation substrate, and also includes a heat radiation member for releasing heat from the double-sided substrate. The heat radiation member is disposed adjacent to one of the first metal plate and the second metal plate generating a larger amount of heat than the other of the first metal plate and the second metal plate.

Other aspects and advantages of the invention will become apparent from the following description, taken in conjunction with the accompanying drawings, illustrating by way of example the principles of the invention.

DETAILED DESCRIPTION OF THE EMBODIMENTS

The following will describe the embodiments of the electronic unit according to the present invention with reference to the accompanying drawings. FIGS. 1, 2A, 2B, 2C and 3 show the first embodiment of the electronic unit embodied as a transformer. The transformer designated generally by 10 has a core 20, primary and secondary coils 30, 31 wound on the core 20, and heat radiation members 40, 41. The primary and secondary coils 30, 31 are provided by a thick copper substrate 50 which corresponds to the double-sided substrate of the present invention.

Figure 2A:
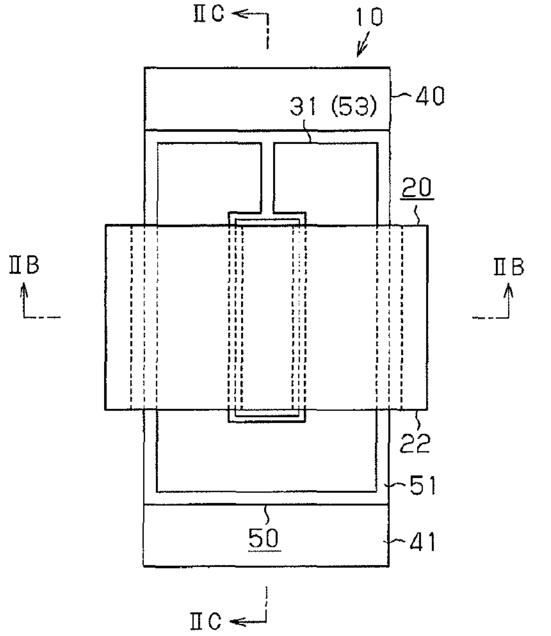
FIG. 2A is a plan view of the transformer of FIG. 1.
Figure 2C:
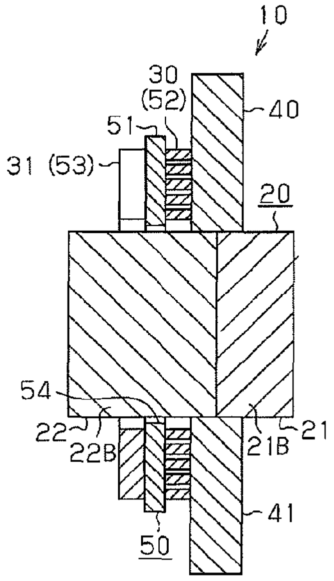
FIG. 2C is a sectional view taken along the line IIC-IIC of FIG. 2A.
Figure 2B:
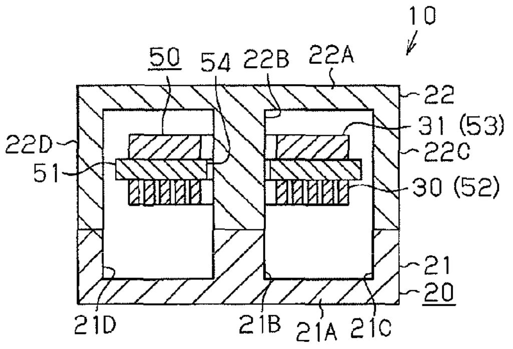
FIG. 2B is a sectional view taken along the line IIB-IIB of FIG. 2A.
Figure 3:
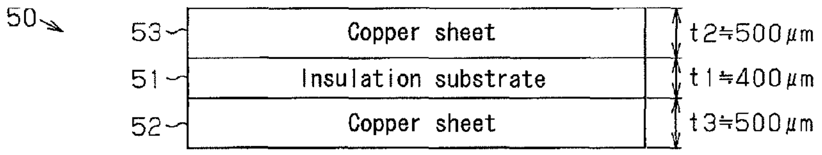
FIG. 3 is a schematic front view of a thick copper substrate used in the transformer of FIG. 1.

As shown in FIG. 3, the thick copper substrate 50 has an insulation substrate 51, a first copper plate 52 and a second copper plate 53. The first copper plate 52 as the first metal plate of the present invention is bonded on one side or the lower surface of the insulation substrate 51 through an adhesive sheet (not shown). The first copper plate 52 is patterned to form the primary coil 30 (see FIGS. 1 and 2). The patterning of the primary coil 30 is accomplished by punching. The insulation substrate 51 is made of, for example, glass or epoxy resin.

The second copper plate 53 as the second metal plate of the present invention is bonded on the other side or the upper surface of the insulation substrate 51 through an adhesive sheet (not shown). The second copper plate 53 is patterned to form the secondary coil 31 (see FIGS. 1 and 2). The patterning of the secondary coil 31 is accomplished by punching.

In this way, at least a part of the thick copper substrate 50 forms the primary and secondary coils 30, 31. For example, the insulation substrate 51 has a thickness of about 400 μm, the first copper plate 52 has a thickness of about 500 μm, and the second copper plate 53 has a thickness of about 500 μm.

The core 20 is an E-E core including two E cores 21, 22. The E core 21 has a rectangular planar base 21A, a center leg 21B projecting from the center of the upper surface of the base 21A, and two outer legs 21C, 21D projecting from the opposite ends of the upper surface of the base 21A. The center legs 21B and the outer legs 21C, 21D all have a rectangular cross section. Similarly, the E core 22 has a rectangular planar base 22A, a center leg 22B projecting from the center of the upper surface of the base 22A, and two outer legs 22C, 22D projecting from the opposite ends of the upper surface of the base 22A. The center legs 22B and the outer legs 22C, 22D all have a rectangular cross section.

The E cores 21, 22 are set in contact with each other at the ends of the center legs 21B, 22B and the outer legs 21C, 21D, 22C, 22D, as most clearly shown in FIG. 2B, thereby forming an E-E core and a also closed magnetic circuit passing therethrough.

In the thick copper substrate 50, the insulation substrate 51 is formed therethrough with a central hole 54 in which the center leg 22B of the E core 22 is inserted. The primary coil 30 patterned in the first copper plate 52 has a shape that a single conductor makes five turns around the central hole 54 of the insulation substrate 51, so that the number of turns in the primary coil 30 is five.

The secondary coil 31 patterned in the second copper plate 53 has a shape that a single conductor makes one turn around the central hole 54 of the insulation substrate 51, so that the number of turns in the secondary coil 31 is one.

The width of the secondary coil 31 in the second copper plate 53 is larger than that of the primary coil 30 in the first copper plate 52. That is, the width of the coil is decreased with an increase of the number of turns in the coil. The electrical resistance and the amount of heat generation are increased with an decrease of the width of the coil.

The heat radiation members 40, 41 are in the form of a rectangular plate and made of a material having a low heat resistance. In the present embodiment, the heat radiation members 40, 41 are made of aluminum for allowing the heat generated in the whole of the coil to be radiated efficiently.

The heat radiation members 40, 41 are horizontally spaced apart from each other and supported by a case (not shown in the drawings) so that the center legs 21B, 22B of the E cores 21, 22 are located between the heat radiation members 40, 41. The thick copper substrate 50 is disposed on the upper surfaces of the heat radiation members 40, 41 with the center leg 22B of the E core 22 inserted through the central hole 54 of the insulation substrate 51 of the thick copper plate 50.

The first copper plate 52 of the thick copper substrate 50 is bonded to the upper surfaces of the respective heat radiation members 40, 41 through a silicone sheet (not shown) for electrical insulation between the first copper plate 52 and the heat radiation members 40, 41. Specifically, the thick copper substrate 50 and the heat radiation members 40, 41 are electrically insulated from each other and bonded together so that the heat generated in the thick copper substrate 50 is released to the heat radiation members 40, 41.

In this way, the coil with smaller width is disposed on the side of the thick copper substrate 50 that is adjacent to the heat radiation members 40, 41, or on the heat radiation side of the thick copper substrate 50. Of the first and second copper plates 52, 53 of the thick copper substrate 50, the first copper plate 52 where a larger amount of heat is generated is disposed adjacent to the heat radiation members 40, 41. Specifically, the first copper plate 52 where the primary coil 30 of a larger number of turns is patterned is disposed adjacent to the heat radiation members 40, 41. Such arrangement of the first copper plate 52 allows efficient heat radiation. Specifically, a larger amount of heat generated on the primary coil 30 of a larger number of turns is radiated by the heat radiation members 40, 41, thereby preventing temperature increase of the coils of the transformer 10.

As described above, according to the first embodiment having the primary coil 30 of five turns and the secondary coil 31 of one turn, the provision of the primary coil 30 on the heat radiation side of the thick copper substrate 50 results in direct and hence efficient heat radiation from the primary coil 30, thereby preventing temperature increase of the primary and secondary coils 30, 31 of the transformer 10.

In a broad sense, the heat radiation members 40, 41 are disposed adjacent to one of the primary coil 30 and the secondary coil 31 generating a larger amount of heat than the other of the primary coil 30 and the secondary coil 31 because of the width of the coil and/or of the amount of current flowing through the coil. Such arrangement allows efficient heat radiation from the heat radiation members 40, 41, thereby preventing temperature increase of the coils of the transformer 10.

Figure 4:
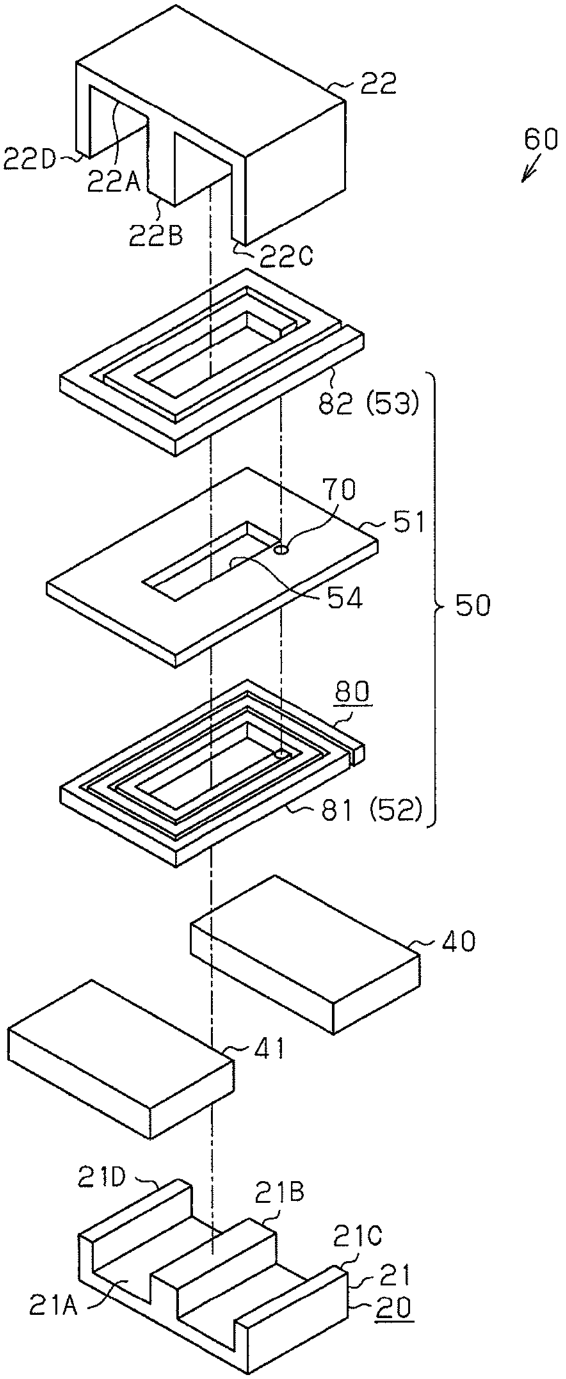
FIG. 4 is an exploded perspective view of an electronic unit embodied as an inductor according to a second embodiment of the present invention.
Figure 5A:
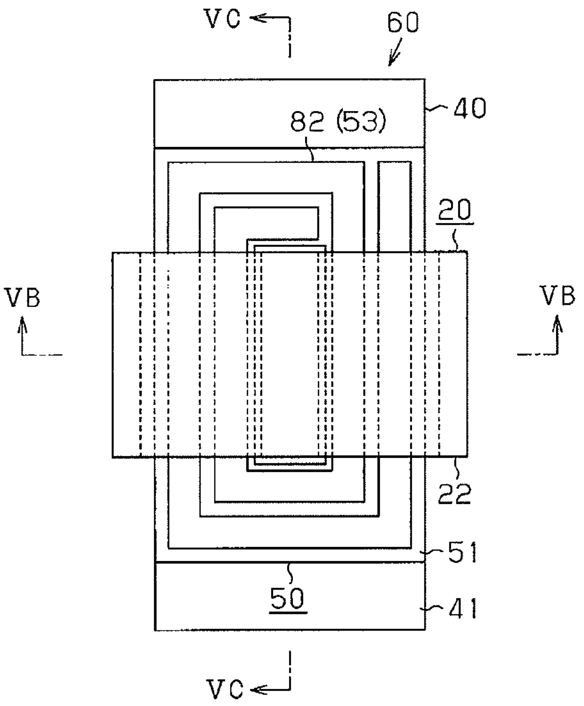
FIG. 5A is a plan view of the inductor of FIG. 4.
Figure 5C:
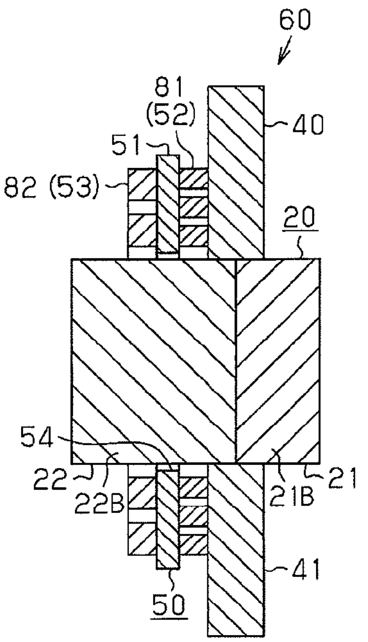
FIG. 5C is a sectional view taken along the line VC-VC of FIG. 5A.
Figure 5B:
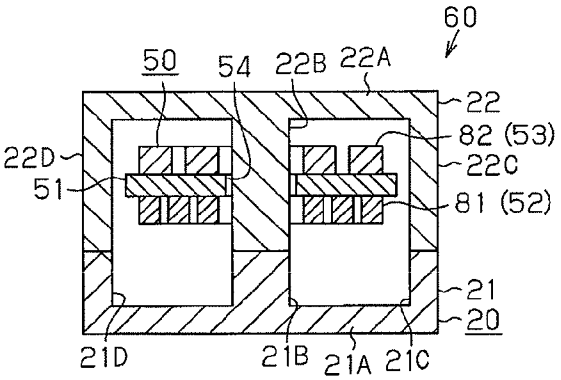
FIG. 5B is a sectional view taken along the line VB-VB of FIG. 5A.

FIGS. 4 and 5 show the second embodiment of the electronic unit embodied as an inductor according to the present invention. In the drawings, same reference numerals are used for the common elements or components in the first and second embodiments, and the description of such elements or components of the second embodiment will be omitted.

As shown in the drawings, the inductor designated generally by 60 has a coil 80 wound on the core 20 and formed by a first coil 81 and a second coil 82. The coil 80 or the first and second coils 81, 82 are provided by the thick copper substrate 50.

In the thick copper substrate 50, the first copper plate 52 is patterned to form the first coil 81, and the second copper plate 53 is patterned to form the second coil 82. The patterning of the first and second coils 81, 82 is accomplished by punching.

In the thick copper substrate 50, the first coil 81 in the first copper plate 52 has a shape that a single conductor makes three turns around the central hole 54 of the insulation substrate 51, so that the number of turns in the first coil 81 is three. The second coil 82 in the second copper plate 53 has a shape that a single conductor makes two turns around the central hole 54 of the insulation substrate 51, so that the number of turns in the second coil 82 is two. One ends of the first and second coils 81, 82 patterned in the respective first and second copper plates 52, 53 are electrically connected to each other through a conductor 70 (FIG. 4) disposed in a hole formed through the insulation substrate 51.

Bonding between the conductor 70 and the ends of the patterns in the respective first and second copper plates 52, 53 is accomplished by any suitable means such as ultrasonic welding, resistance welding, or solder bonding.

In this way, at least a part of the thick copper substrate forms a single coil. Specifically, one side of the thick copper substrate forms a part of the single coil, and the other side of the thick copper substrate forms the rest of the single coil, and the coils formed on the respective sides of the thick copper substrate are electrically connected by the conductor 70 thereby to form the single coil.

The width of the second coil 82 in the second copper plate 53 is larger than that of the first coil 81 in the first copper plate 52. That is, the width of the coil is decreased with an increase of the number of turns in the coil. The electrical resistance and the amount of heat generation are increased with an decrease of the width of the coil.

The first copper plate 52 of the thick copper substrate 50 is bonded to the upper surfaces of the respective heat radiation members 40, 41 through a silicone sheet (not shown) for electrical insulation between the first copper plate 52 and the heat radiation members 40, 41. In this way, the thick copper substrate 50 has a structure that the number of turns of the first coil 81 on the heat radiation side is larger than that of the second coil 82 on the opposite side.

Of the first and second copper plates 52, 53 of the thick copper substrate 50, the first copper plate 52 where a larger amount of heat is generated is disposed adjacent to the heat radiation members 40, 41. Specifically, the first copper plate 52 where the first coil 81 of a larger number of turns is patterned is disposed adjacent to the heat radiation members 40, 41. Such arrangement of the first copper plate 52 allows efficient heat radiation. Specifically, a larger amount of heat generated on the first coil 81 of a larger number of turns is radiated by the heat radiation members 40, 41, thereby preventing temperature increase of the coil 80 of the inductor 60.

According to the second embodiment wherein the inductor 60 has the coil 80 of five turns, the provision of the first coil 81 of three turns on the heat radiation side and of the second coil 82 of two turns on the opposite side results in direct and hence efficient heat radiation from the first coil 81 of three turns, thereby preventing temperature increase of the coil 80 of the inductor 60.

Figure 6A:
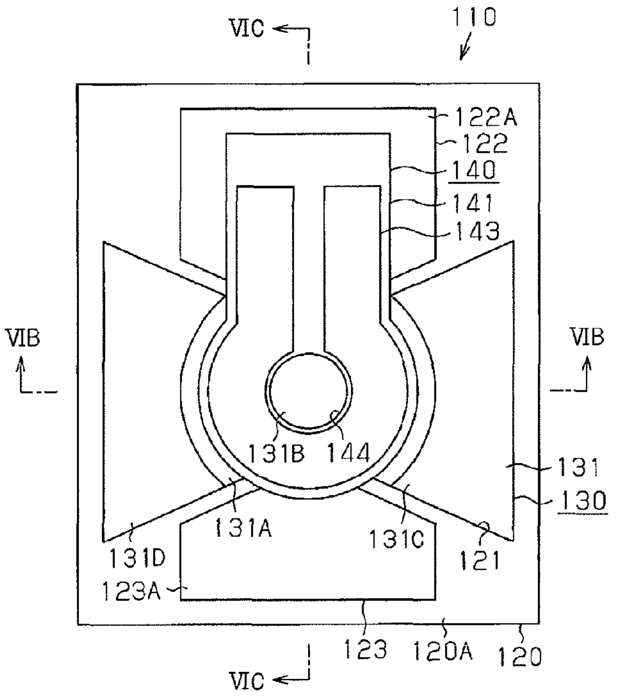
FIG. 6A is a plan view of an electronic unit embodied as a transformer according to a third embodiment of the present invention.
Figure 6C:
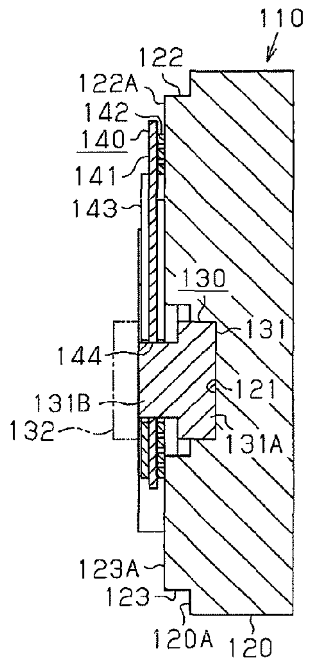
FIG. 6C is a sectional view taken along the line VIC-VIC of FIG. 6A.
Figure 6B:
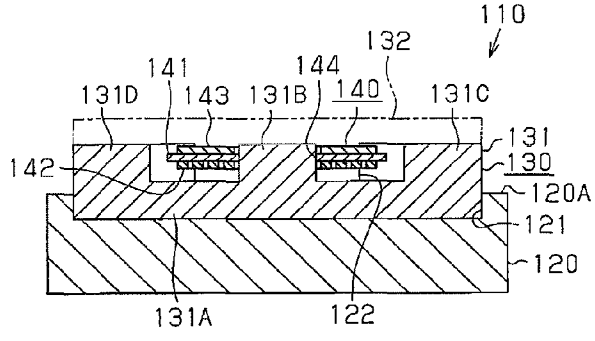
FIG. 6B is a sectional view taken along the line VIB-VIB of FIG. 6A.
Figure 7A:
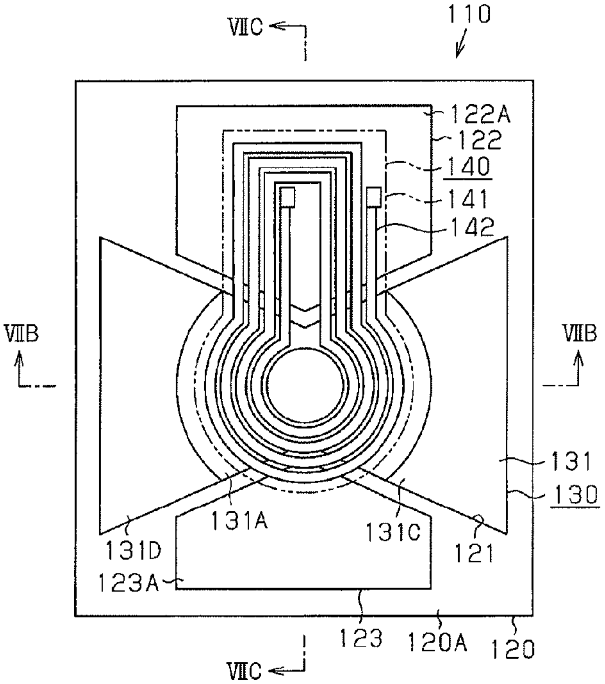
FIG. 7A is similar to FIG. 6A, but showing the transformer in plan view with several components removed.
Figure 7C:
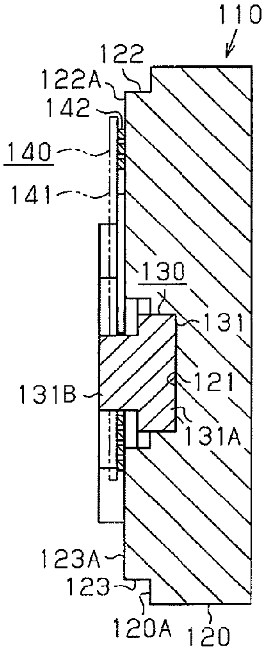
FIG. 7C is a sectional view taken along the line VIIC-VIIC of FIG. 7A.
Figure 7B:
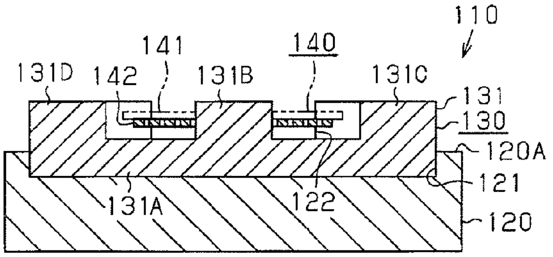
FIG. 7B is a sectional view taken along the line VIIB-VIIB of FIG. 7A.

FIGS. 6 and 7 show the third embodiment of the electronic unit embodied as a transformer according to the present invention.

Figure 1:
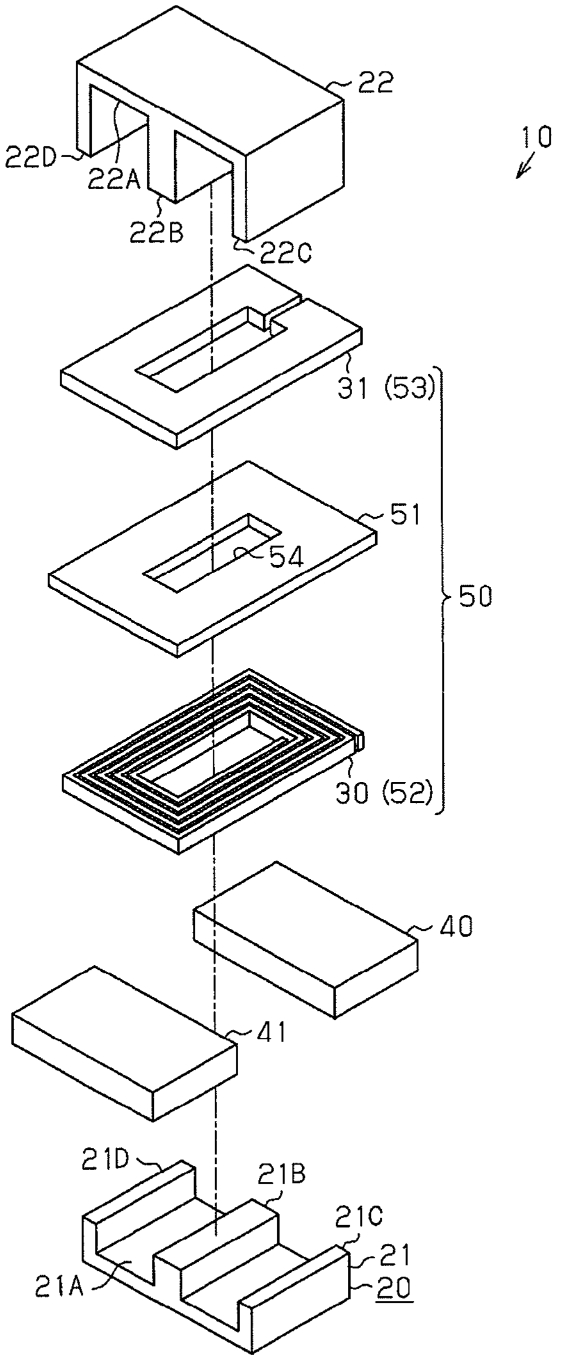
FIG. 1 is an exploded perspective view of an electronic unit embodied as a transformer according to a first embodiment of the present invention.

The third embodiment differs from the first embodiment in that the case designated by 120 replaces the plate shaped heat radiation members 40, 41 of the transformer 10 of FIG. 1 so that the heat generated in the coils of the transformer is released to the case 120. The case 120 corresponds to the heat radiation member of the present invention.

The core designated generally by 130 is an E-I core including an E core 131 and an I core 132. In FIG. 6, the I core 132 is indicated by two-dot chain line. The thick copper substrate designated generally by 140 corresponds to the double-sided substrate of the present invention and is composed of an insulation substrate 141, a first copper plate 142 and a second copper plate 143. The first copper plate 142 as the first metal plate of the present invention is bonded on one side or the lower surface of the insulation substrate 141. The first copper plate 142 is patterned to form the primary coil of the transformer 110.

The second copper plate 143 as the second metal plate of the present invention is bonded on the other side or the upper surface of the insulation substrate 141. The second copper plate 143 is patterned to form the secondary coil of the transformer 110. The patterning of the primary and secondary coils is accomplished by punching.

In this way, a part of the thick copper substrate 140 forms the primary and secondary coils of the transformer 110. In FIG. 7, the illustration of the I core 132 and the second copper plate 143 (secondary coil) shown in FIG. 6 is omitted for simplicity, and the insulation substrate 141 is indicated by two-dot chain line.

The case 120 is of a plate shape and has in the upper surface 120A thereof a recess 121 in which the E core 131 is disposed. The E core 131 has a rectangular planar base 131A, a center leg 131B projecting from the center of the upper surface of the base 131A, and two outer legs 131C, 131D projecting from the opposite ends of the upper surface of the base 131A. As seen from FIG. 6A, the center leg 131B has a cylindrical shape.

As shown in FIGS. 6A and 6C, the case 120 has in the upper surface 120A thereof substrate mountings 122, 123 on the opposite sides of the central leg 131B of the E core 131. The substrate mountings 122, 123 have upper surfaces 122A, 123A, respectively, which are flat and at the same level.

The thick copper substrate 140 is placed on the upper surfaces 122A, 123A of the substrate mountings 122, 123 of the case 120 with a silicone sheet (not shown in the drawings) interposed therebetween. Thus, the heat generated in the thick copper substrate 140 is released to the substrate mountings 122, 123 of the case 120.

In the thick copper substrate 140, the insulation substrate 141 is formed therethrough with a central hole 144 in which the center leg 131B of the E core 131 is inserted. The primary coil patterned in the first copper plate 142 has a shape that a single conductor makes four turns around the central hole 144 of the insulation substrate 141, as shown in FIG. 7A, so that the number of turns in the primary coil is four. The secondary coil patterned in the second copper plate 143 has a shape that a single conductor makes one turn around the central hole 144 of the insulation substrate 141, as shown in FIG. 6A, so that the number of turns in the secondary coil is one.

The width of the secondary coil in the second copper plate 143 is larger than that of the primary coil in the first copper plate 142. That is, the width of the coil is decreased with an increase of the number of turns in the coil. The electrical resistance and the amount of heat generation are increased with an decrease of the width of the coil.

The first copper plate 142 of the thick copper substrate 140 is bonded to the upper surfaces 122A, 123A of the substrate mountings 122, 123 while being insulated from each other. Thus, the primary coil of a smaller width is disposed on the heat radiation side of the thick copper substrate 140.

According to the third embodiment having the primary coil of four turns in the first copper plate 142 and the secondary coil of one turn in the second copper plate 143, the provision of the primary coil or the first copper plate 142 on the heat radiation side of the thick copper substrate 140 results in direct and hence efficient heat radiation from the primary coil, thereby preventing temperature increase of the coils of the transformer 110.

Figure 8:
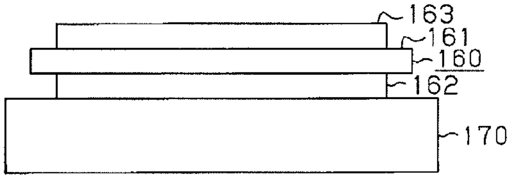
FIG. 8 is a schematic front view of an electronic unit according to a fourth embodiment of the present invention.
Figure 9:
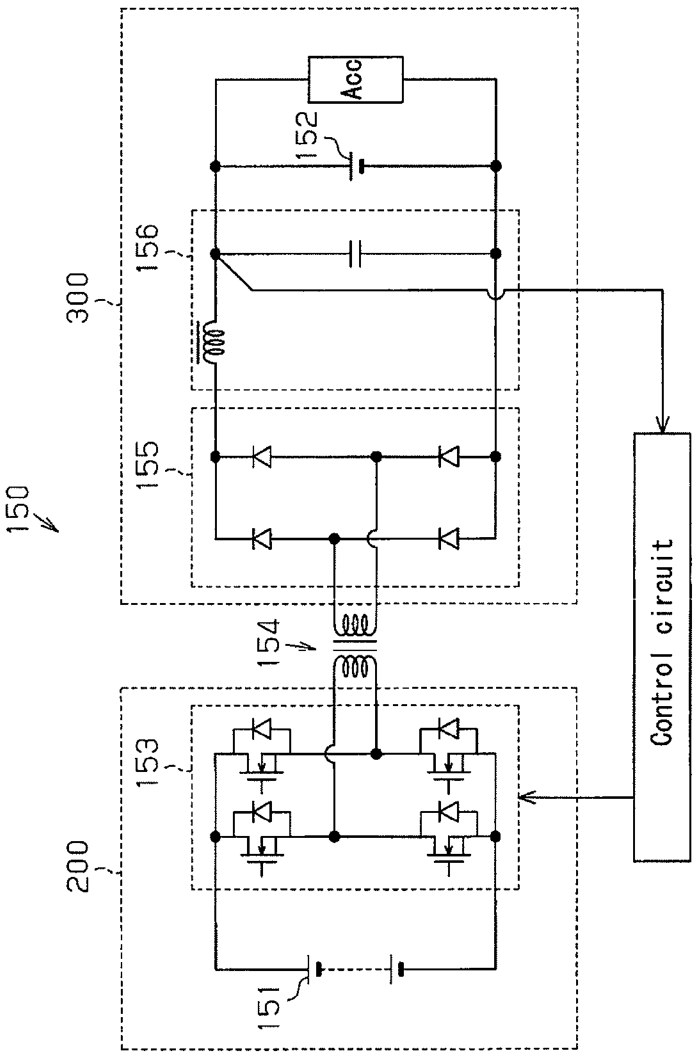
FIG. 9 is a circuit diagram of the electric unit of FIG. 8.

FIGS. 8 and 9 show the fourth embodiment of the electronic unit embodied as a DC-DC converter according to the present invention.

As shown in FIG. 9, the DC-DC converter designated generally by 150 is used in a plug-in hybrid vehicle or an electric vehicle as a power source to supply electric power from a high voltage battery 151 to accessories or a battery 152. In FIG. 9, the DC-DC converter 150 has an H bridge circuit 153, a transformer 154, a rectification H bridge circuit 155, and a smoothing circuit 156. The H bridge circuit 153 has four switching devices, the rectification H bridge circuit 155 has four diodes, and the smoothing circuit 156 has a coil and a capacitor.

As shown in FIG. 8, the thick copper substrate designated generally by 160 corresponds to the double-sided substrate of the present invention and is composed of an insulation substrate 161, a first copper plate 162 and a second copper plate 163. The first copper plate 162 as the first metal plate of the present invention is bonded on one side or the lower surface of the insulation substrate 161. The first copper plate 162 is patterned to form the primary coil of five turns of the transformer 154 (FIG. 9). The patterning of the primary coil is accomplished by punching.

The second copper plate 163 as the second metal plate of the present invention is bonded on the other side or the upper surface of the insulation substrate 161. The second copper plate 163 is patterned to form the secondary coil of one turn of the transformer 154 (FIG. 9). The patterning of the secondary coil is accomplished by punching.

In the transformer 154, although the amount of current flowing through the secondary circuit 300 is greater than the amount of current flowing through the primary circuit 200, the primary coil of the transformer 154 has a smaller width and, therefore, a larger amount of heat is generated on the primary coil.

As shown in FIG. 8, the thick copper substrate 160 is bonded to the upper surface of the heat radiation member 170 through a silicone sheet (not shown) for electrical insulation between the thick copper substrate 160 and the heat radiation member 170. In this case, the first copper plate 162 is located on the side of the thick copper substrate 160 adjacent to the heat radiation member 170, so that the primary coil of five turns generating a larger amount of heat is disposed on the heat radiation side. That is, of the first and second copper plates 162, 163, the first copper plate 162 generating a larger amount of heat is disposed closer to the heat radiation member 170.

The above-described embodiments may be modified in various ways as exemplified below.

Heat radiation accomplished by using the case 120 as in the third embodiment may be applied to the inductor as described in the second embodiment.

In the transformer, the number of turns in the primary and secondary coils patterned in the respective first and second copper plates may be changed as required. For example, the number of turns in the primary coil may be three, and the number of turns in the secondary coil may be one.

Also in the inductor, the number of turns in the coils in the respective first and second copper plates may be changed. For example, the number of turns in the coil in the first copper plate may be three, and the number of turns in the coil in the second copper plate may be one.

In the previous embodiments, the thick copper substrate as the double-sided substrate has the copper plates bonded on the both sides of the insulation substrate. Alternatively, any metal plate other than the copper plate, such as aluminum plate, may be bonded on the both sides of the insulation substrate.

In the first and second embodiments, when the heat radiation members 40, 41 need to be magnetically insulated so that magnetic circuit is not formed through the heat radiation members 40, 41 as in the case that the heat radiation member is disposed in the core, any suitable magnetically insulating material such as a resin having a high heat conductivity may be used as the heat radiation members 40, 41.

What is claimed is:

1. An electronic unit, comprising:

a double-sided substrate having an insulation substrate, a first coil bonded on one side of the insulation substrate, and a second coil bonded on another side of the insulation substrate;

a core on which the first coil and the second coil are wound; and a heat radiation member for releasing heat from the double-sided substrate, the heat radiation member comprising:

a case of a plate shape having a recess in which the core is disposed;

surfaces that are horizontally spaced apart from each other such that the core is located between the surfaces; and substrate mountings having the surfaces, wherein the surfaces of the heat radiation member are provided on one of the first coil and the second coil that generates a larger amount of heat than another of the first coil and the second coil such that the one of the first coil and the second coil is electrically insulated from the heat radiation member.

2. The electronic unit according to claim 1, wherein the electronic unit is a transformer, wherein the first coil is a primary coil, and the second coil is a secondary coil.

3. The electronic unit according to claim 2, wherein the heat radiation member is disposed adjacent to one of the primary coil and the secondary coil that generates the larger amount of heat than another of the primary coil and the secondary coil because of one of a width of each turn of the one of the primary coil and the secondary coil, an amount of current flowing through the one of the primary coil and the secondary coil, or a combination of the width of each turn of the one of the primary coil and the secondary coil and the amount of current flowing through the one of the primary coil and the secondary coil.

4. The electronic unit according to claim 3, wherein the heat radiation member is disposed adjacent to the one of the primary coil and the secondary coil having a larger number of turns than the another of the primary coil and the secondary coil.

5. The electronic unit according to claim 1, wherein the electronic unit is an inductor, and wherein the second coil is electrically connected to the first coil to form a single coil.

6. The electronic unit according to claim 5, wherein the heat radiation member is disposed adjacent to the one of the first coil and the second coil having a larger number of turns than the another of the first coil and the second coil.

7. The electronic unit according to claim 1, wherein each of the first coil and the second coil is a copper plate that is patterned by punching.

8. The electronic unit according to claim 1, wherein each of the first coil and the second coil is patterned in a metal plate.

* * * * *